(12) United States Patent
Holmes et al.

(10) Patent No.: US 11,522,116 B2
(45) Date of Patent: Dec. 6, 2022

(54) VERTICAL AL/EPI SI/AL, AND ALSO AL/AL OXIDE/AL, JOSEPHSON JUNCTION DEVICES FOR QUBITS

(71) Applicant: INTERNATIONAL BUSINESS MACHINES CORPORATION, Armonk, NY (US)

(72) Inventors: Steven J. Holmes, Ossining, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/847,277

(22) Filed: Apr. 13, 2020

(65) Prior Publication Data
US 2021/0320240 A1  Oct. 14, 2021

(51) Int. Cl.
*H01L 39/22* (2006.01)
*H01L 39/24* (2006.01)
*H01L 39/02* (2006.01)

(52) U.S. Cl.
CPC .......... *H01L 39/223* (2013.01); *H01L 39/025* (2013.01); *H01L 39/2493* (2013.01)

(58) Field of Classification Search
CPC .......... H01L 39/025; H01L 39/223–226; H01L 39/2493–2496; H01L 39/00–2496; H01L 27/18; H01L 35/225; H01L 21/76891; H01L 23/49888; G06N 10/00
See application file for complete search history.

(56) References Cited

U.S. PATENT DOCUMENTS

| | | | | |
|---|---|---|---|---|
| 5,087,605 | A * | 2/1992 | Hegde | H01L 39/225 257/33 |
| 5,430,013 | A * | 7/1995 | Inada | H01L 39/228 257/34 |
| 6,753,546 | B2 | 6/2004 | Tzalenchuk et al. | |
| 9,425,377 | B2 * | 8/2016 | Moyerman | H01L 39/228 |
| 10,256,392 | B1 * | 4/2019 | Brink | G06N 10/00 |

(Continued)

FOREIGN PATENT DOCUMENTS

WO  2019125498 A1  6/2019
WO  2019173448 A1  9/2019

OTHER PUBLICATIONS

A Grockowiak et al., "Superconducting properties of laser annealed implanted Si:B epilayers", Supercond. Sci. Technol. 26 (2013) 045009 (4pp).

(Continued)

*Primary Examiner* — Shahed Ahmed
(74) *Attorney, Agent, or Firm* — Amin, Turocy & Watson, LLP

(57) ABSTRACT

A vertical Josephson junction device includes a substrate, and an epitaxial stack formed on the substrate. The vertical Josephson junction device includes a first superconducting electrode embedded in the epitaxial stack, and a second superconducting electrode embedded in the epitaxial stack, the second superconducting electrode being separated from the first superconducting electrode by a dielectric layer. In operation, the first superconducting electrode, the dielectric layer, and the second superconducting electrode form a vertical Josephson junction.

9 Claims, 17 Drawing Sheets

(56) References Cited

U.S. PATENT DOCUMENTS

| | | |
|---|---|---|
| 10,367,132 B2 | 7/2019 | Krogstrup et al. |
| 10,453,894 B2 | 10/2019 | Ladizinsky et al. |
| 2017/0141285 A1 | 5/2017 | Krogstrup et al. |
| 2018/0013053 A1* | 1/2018 | Lebby ............... H01L 39/2432 |
| 2018/0308896 A1 | 10/2018 | Ladizinsky et al. |

OTHER PUBLICATIONS

F. Chiodi et al., "All silicon Josephson junctions", arXiv:1610.08453v1 [cond-mat.mes-hall] Oct. 26, 2016.

Brandur Thorgrimsson et al., "The effect of external electric fields on silicon with superconducting gallium nano-precipitates", arXiv:1911.06931v1 [physics.app-ph] Nov. 16, 2019.

Khalid Hoummada et al.,. "Absence of boron aggregates in superconducting silicon confirmed by atom probe tomography.",Applied Physics Letters, American Institute of Physics, 2012, 101, pp. 182602. ff10.1063/1.4760261ff.ffhal-00760773f.

C. Marcenat et al., "Low-temperature transition to a superconducting phase in boron-doped silicon films grown on (001)-oriented silicon wafers", Physical Review B 81, 020501 (R) (2010).

E. Bustarret et al., "Superconductivity in doped cubic silicon", Nature, vol. 444, Nov. 23, 2006 Letters.

\* cited by examiner

VERTICAL AL/EPI SI/AL, AND ALSO AL/AL OXIDE/AL, JOSEPHSON JUNCTION DEVICES FOR QUBITS

BACKGROUND

The currently claimed embodiments of the present invention relate to quantum mechanical devices, and more specifically, to vertical Josephson junction devices formed in a nanosheet epitaxial film stack.

Coherence times of Josephson junction qubits are generally low, possibly related to defects found in the qubit structures. These defects may be introduced during formation of the Josephson junction layers, or after formation when portions of the Josephson junction layers are exposed to air. Materials and methods are needed for improving coherence times in Josephson junction devices.

SUMMARY

According to an embodiment of the present invention, a vertical Josephson junction device includes a substrate, and an epitaxial stack formed on the substrate. The vertical Josephson junction device includes a first superconducting electrode embedded in the epitaxial stack, and a second superconducting electrode embedded in the epitaxial stack, the second superconducting electrode being separated from the first superconducting electrode by a dielectric layer. In operation, the first superconducting electrode, the dielectric layer, and the second superconducting electrode form a vertical Josephson junction.

According to an embodiment of the present invention, a method of producing a vertical Josephson junction device includes forming an epitaxial stack comprising a plurality of layers on a substrate, and replacing a portion of a first layer of the plurality of layers with a first region of superconducting material to form a first electrode. The method includes replacing a portion of a second layer of the plurality of layers with a second region of superconducting material to form a second electrode, the second electrode being separated from the first electrode by a dielectric layer. In operation, the first electrode, the dielectric layer, and the second electrode form a vertical Josephson junction.

DETAILED DESCRIPTION

Figure 1:
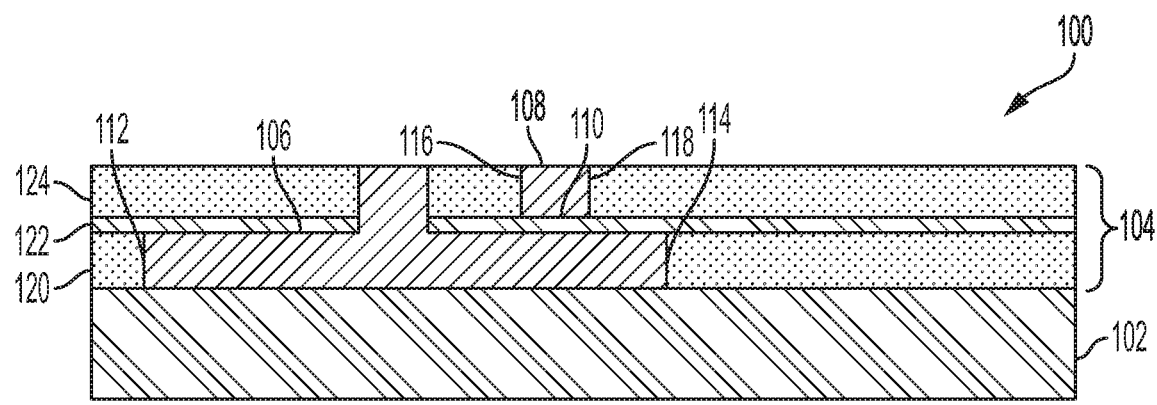
FIG. 1 is a schematic illustration of a cross-sectional view of a vertical Josephson junction device according to an embodiment of the present invention.

FIG. 1 is a schematic illustration of a cross-sectional view of a vertical Josephson junction device 100 according to an embodiment of the present invention. The vertical Josephson junction device 100 includes a substrate 102, and an epitaxial stack 104 formed on the substrate 102. The vertical Josephson junction device 100 includes a first superconducting electrode 106 embedded in the epitaxial stack 104, and a second superconducting electrode 108 embedded in the epitaxial stack 104. The second superconducting electrode 108 is separated from the first superconducting electrode 106 by a dielectric layer 110. In operation, the first superconducting electrode 106, the dielectric layer 110, and the second superconducting electrode 108 form a vertical Josephson junction.

According to some embodiments, the dielectric layer 110 comprises a layer 120 of the epitaxial stack 104. As illustrated in FIG. 1, the epitaxial stack 104 laterally encases the vertical Josephson junction. For example, in the cross-sectional view FIG. 1, the first superconducting electrode 106 is surrounded by the epitaxial stack 104 on the left side 112 and the right side 114. Similarly, the second superconducting electrode 108 is surrounded by the epitaxial stack 104 on the left side 116 and the right side 118. The layer 120 of the epitaxial stack 104 that forms the dielectric layer 110 in the region between the first superconducting electrode 106 and the second superconducting electrode 108 extends to the left and right of the Josephson junction, and therefore the epitaxial stack laterally encases the vertical Josephson junction. By encasing the vertical Josephson junction, the epitaxial stack isolates the vertical Josephson junction from the environment. This prevents defects from being formed, for example, due to oxidation. By avoiding the formation of defects, the coherence time of the vertical Josephson junction device can be improved.

According to some embodiments, the epitaxial stack 104 includes a SiGe epitaxial film 120, and a Si epitaxial film 122. The epitaxial stack 104 may further include a second SiGe epitaxial film 124.

Figure 2:
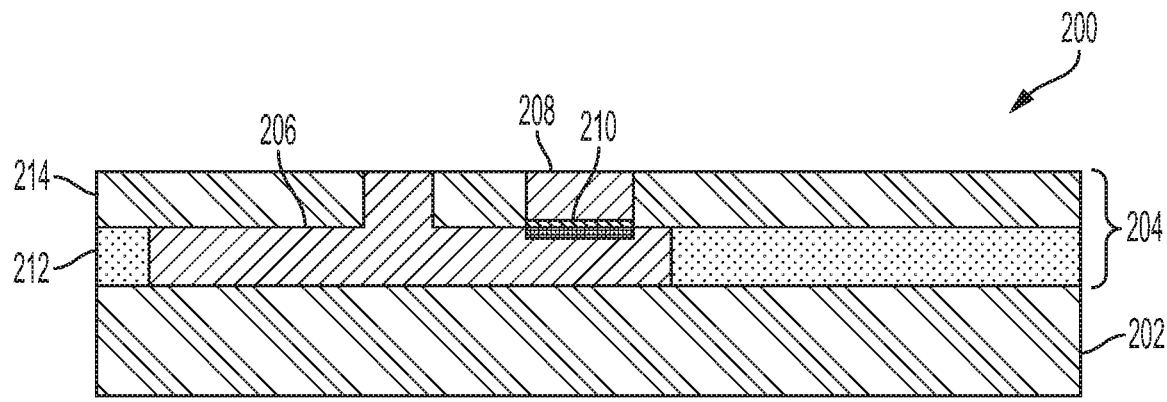
FIG. 2 is a schematic illustration of a cross-sectional view of a vertical Josephson junction device according to an embodiment of the present invention.

FIG. 2 is a schematic illustration of a cross-sectional view of a vertical Josephson junction device 200 according to an embodiment of the present invention. The vertical Josephson junction device 200 includes a substrate 202, and an epitaxial stack 204 formed on the substrate 202. The vertical Josephson junction device 200 includes a first superconducting electrode 206 embedded in the epitaxial stack 204, and a second superconducting electrode 208 embedded in the epitaxial stack 204. The second superconducting electrode 208 is separated from the first superconducting electrode 206 by a dielectric layer 210. In operation, the first superconducting electrode 206, the dielectric layer 210, and the second superconducting electrode 208 form a vertical Josephson junction.

According to some embodiments, the dielectric layer 210 comprises an oxide layer formed on the first superconducting electrode 206. As schematically illustrated in FIG. 2, the epitaxial stack 204 laterally encases the vertical Josephson junction. The epitaxial stack 204 isolates the vertical Josephson junction from the environment. The epitaxial stack according to some embodiments includes a SiGe epitaxial film 212 and a Si epitaxial film 214.

Figure 3:
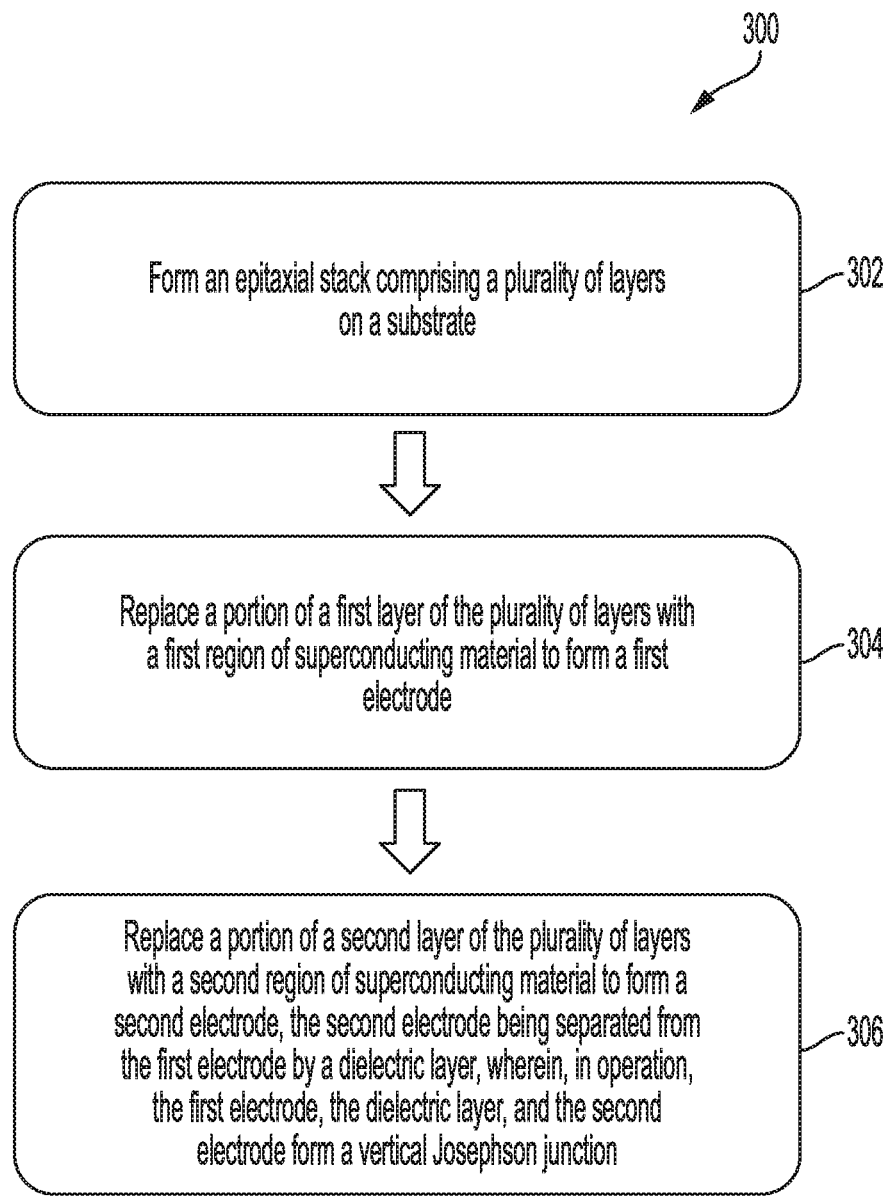
FIG. 3 is a flowchart illustrating a method of producing a vertical Josephson junction device according to an embodiment of the present invention.

FIG. 3 is a flowchart illustrating a method 300 of producing a vertical Josephson junction device according to an embodiment of the present invention. The method 300 includes forming an epitaxial stack comprising a plurality of layers on a substrate 302. The method 300 includes replacing a portion of a first layer of the plurality of layers with a first region of superconducting material to form a first electrode 304. The method includes replacing a portion of a second layer of the plurality of layers with a second region of superconducting material to form a second electrode, the second electrode being separated from the first electrode by a dielectric layer, wherein, in operation, the first electrode, the dielectric layer, and the second electrode form a vertical Josephson junction 306.

According to some embodiments, the dielectric layer comprises a third layer of the epitaxial stack. According to some embodiments, the method 300 further includes forming the dielectric layer on the first electrode. Replacing the portion of the first layer of the plurality of layers may include removing the portion of the first layer and depositing the first region of superconducting material to form the first electrode. Replacing the portion of the second layer of the plurality of layers may include removing the portion of the second layer and depositing the second region of superconducting material to form the second electrode.

According to some embodiments, forming the epitaxial stack includes forming a SiGe epitaxial film and a Si epitaxial film. Forming the epitaxial stack may further include forming a second SiGe epitaxial film.

Figure 4:
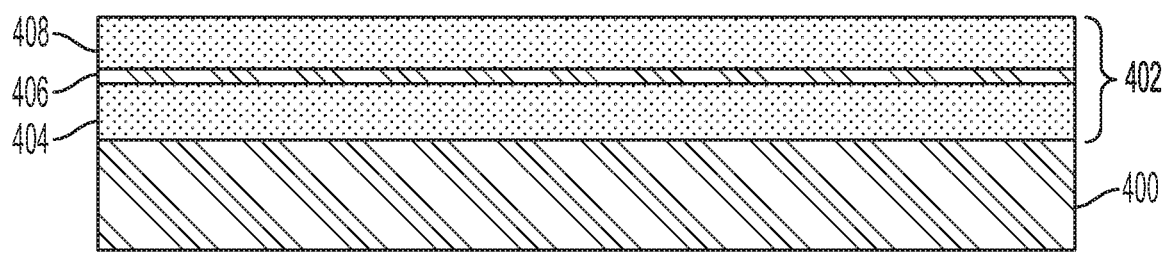
FIG. 4 is a cross-sectional view of a substrate according to an embodiment of the present invention.

FIGS. 4-18 schematically illustrate an example process for forming a vertical Josephson junction device according to some embodiments of the present invention. FIG. 4 is a cross-sectional view of a substrate 400. The process includes forming an epitaxial stack 402 on the substrate 400. The epitaxial stack 402 may include a plurality of epitaxial films. According to some embodiments, the substrate 400 is a Si substrate. According to some embodiments, the epitaxial stack 402 includes a first SiGe film 404 formed on the substrate 400, a Si film 406 formed on the first SiGe film 404, and a second SiGe film 408 formed on the Si film 406. The first SiGe film 404, the Si film 406, and the second SiGe film 408 may each be formed epitaxially. Embodiments of the invention are not limited to these materials, however. The substrate 400 and epitaxial stack 402 may include alternative or additional materials. For example, the substrate may be a Ge substrate. The layers 404-408 of the epitaxial stack, including the Josephson junction barrier layer, may include Si, Ge, or SiGe, for example.

Figure 5:
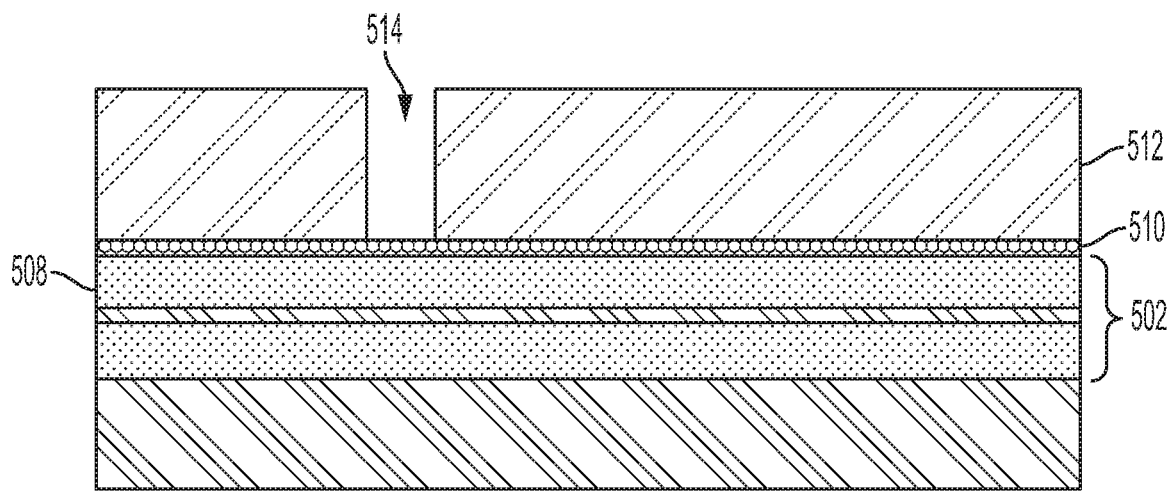
FIG. 5 is a schematic illustration of a cross-sectional view of a hard mask and a lithography stack formed on an epitaxial stack according to an embodiment of the present invention.

The process includes forming a hard mask and a lithography stack on the epitaxial stack. FIG. 5 is a schematic illustration of a cross-sectional view of a hard mask 510 and a lithography stack 512 formed on an epitaxial stack 502. The hard mask may include, for example, silicon oxide. The process includes patterning contact hole regions to access a layer, for example, the second SiGe film 508, of the epitaxial stack 502. In FIG. 5, the lithography stack 512 has been etched to form a contact hole region 514.

Figure 6:
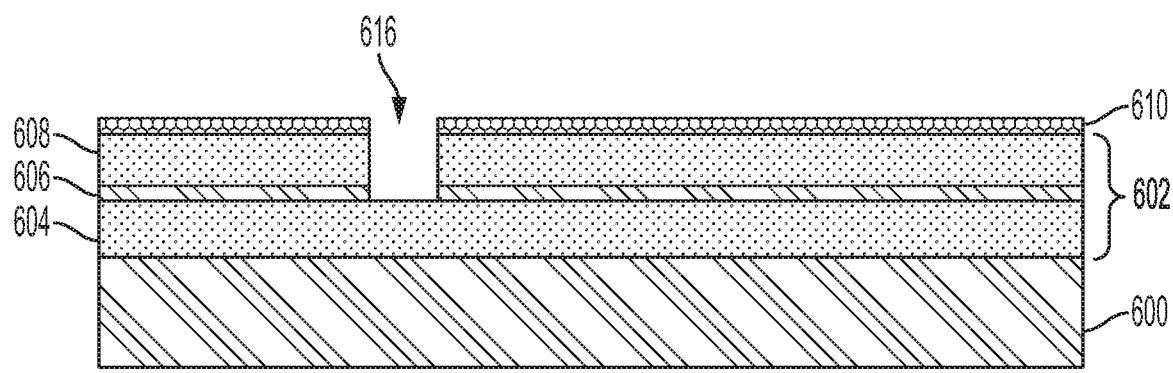
FIG. 6 is a schematic illustration of a cross-sectional view of the substrate and epitaxial stack after a contact hole region has been etched, and the lithography stack stripped according to an embodiment of the present invention.

The process includes etching the contact hole regions to access a lower layer of the epitaxial stack, and then stripping the lithography stack. FIG. 6 is a schematic illustration of a cross-sectional view of the substrate 600 and epitaxial stack 602 after the contact hole region has been etched, and the lithography stack stripped. The epitaxial stack 602 includes a hole region 616 where portions of the hard mask 610, second SiGe film 608, and Si film 606 have been etched. A surface of the first SiGe film 604 is exposed by the hole region 616.

Figure 7:
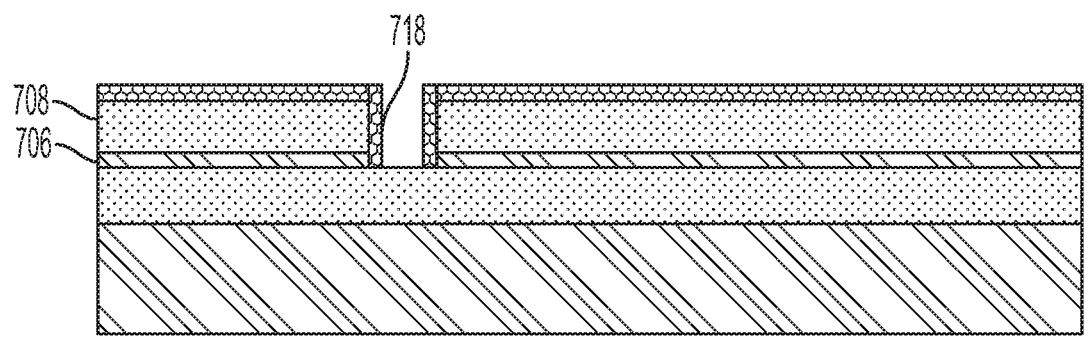
FIG. 7 is a schematic illustration of a cross-sectional view of a sidewall spacer according to an embodiment of the present invention.

The process includes depositing a Si oxide film and etching a sidewall spacer. FIG. 7 is a schematic illustration of a cross-sectional view of the sidewall spacer 718. The sidewall spacer 718 protects the second SiGe film 708 and the Si film 706 during subsequent etching processes.

Figure 8:
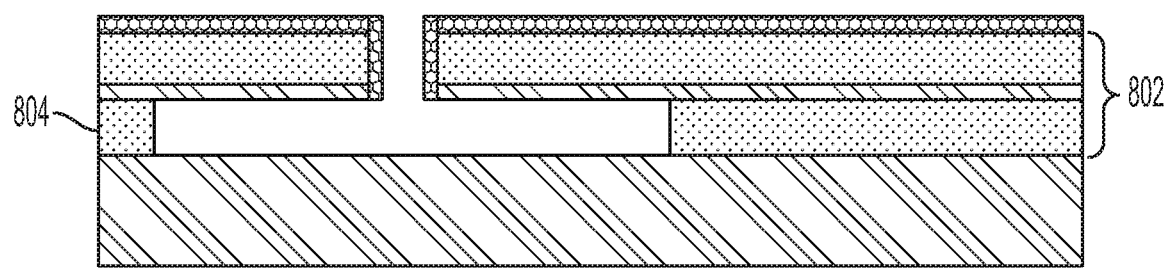
FIG. 8 is a schematic illustration of a cross-sectional view of the epitaxial stack after a portion of a first SiGe film has been removed according to an embodiment of the present invention.

The process includes removing a portion of the first SiGe film. FIG. 8 is a schematic illustration of a cross-sectional view of the epitaxial stack 802 after a portion of the first SiGe film 804 has been removed. For example, the portion of the first SiGe film 804 may be removed by vapor etching.

Figure 9:
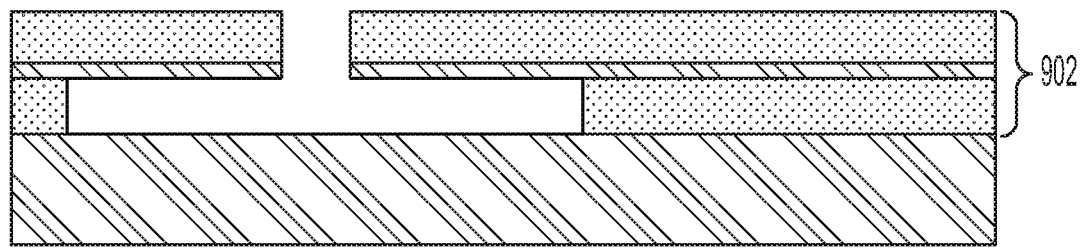
FIG. 9 is a schematic illustration of a cross-sectional view of the epitaxial stack after a hard mask and the sidewall spacer have been removed according to an embodiment of the present invention.

The process includes removing the hard mask and the sidewall spacer. FIG. 9 is a schematic illustration of a cross-sectional view of the epitaxial stack 902 after the hard mask and the sidewall spacer have been removed. The hard mask and the sidewall spacer may be removed using dilute hydrofluoric acid (DHF), for example.

Figure 10:
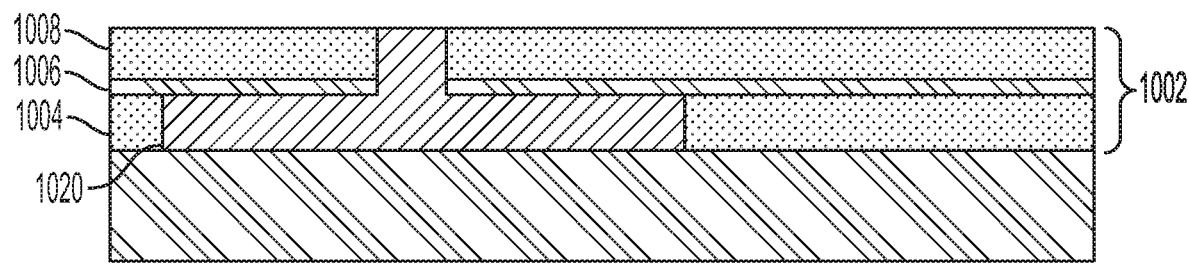
FIG. 10 is a schematic illustration of a cross-sectional view of a superconducting material deposited in an etched region of the epitaxial stack according to an embodiment of the present invention.

The process includes depositing a superconducting material to form a first electrode, and removing excess material formed on the surface of the epitaxial stack. FIG. 10 is a schematic illustration of a cross-sectional view of a superconducting material deposited in the etched region of the epitaxial stack 1002. The superconducting material forms a first electrode 1020. The superconducting material replaces a portion of the first SiGe film 1004. The superconducting material may also replace a portion of the Si film 1006, and a portion of the second SiGe film 1008, as illustrated in FIG. 10.

The superconducting material may be deposited using chemical vapor deposition (CVD) or atomic layer deposition (ALD), for example. The superconducting material may be, for example, aluminum. Excess material may be removed from the top surface of the second SiGe film 1008, for example, using chemical-mechanical polishing (CMP). According to some embodiments, a TaN or TiN ALD liner could be used. It may be desirable to control the interface between the junction dielectric and the superconductor in a very specific way. ALD processing with TiN or TaN may be more uniform, or may provide better junction behavior.

Figure 11:
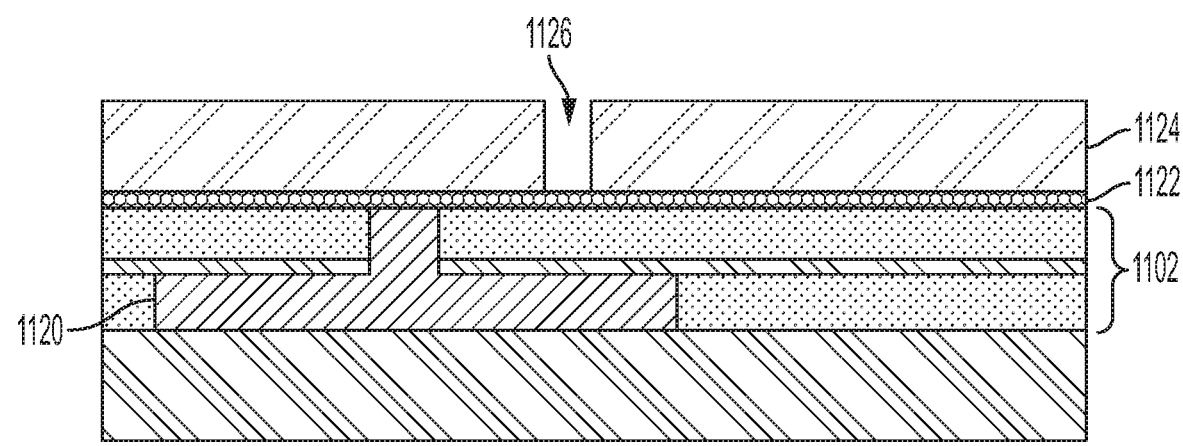
FIG. 11 is a schematic illustration of a cross-sectional view of the epitaxial stack and first electrode with a hard mask and a lithography stack formed on the epitaxial stack according to an embodiment of the present invention.

The process includes depositing a hard mask and patterning a lithography stack to form the second electrode of Josephson junction device. FIG. 11 is a schematic illustration of a cross-sectional view of the epitaxial stack 1102 and first electrode 1120 with a hard mask 1122, for example, comprising silicon oxide, and a lithography stack 1124 formed on the epitaxial stack 1102. The lithography stack 1124 has been patterned to form a hole 1126.

Figure 12:
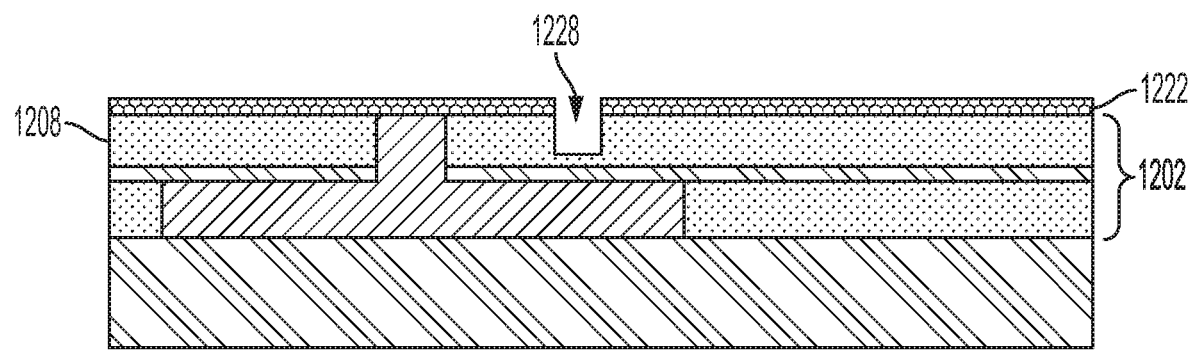
FIG. 12 is a schematic illustration of a cross-sectional view of the silicon oxide hard mask and the epitaxial stack after the etching and subsequent stripping of the lithography stack according to an embodiment of the present invention.

The process includes etching the silicon oxide hard mask, partially etching the second SiGe layer, and stripping the lithography stack. FIG. 12 is a schematic illustration of a cross-sectional view of the silicon oxide hard mask 1222 and the epitaxial stack 1202 after the etching and subsequent stripping of the lithography stack. The silicon oxide hard mask 1222 has been etched to expose the second SiGe layer 1208, and a portion of the second SiGe layer 1208 has been removed, creating a hole 1228 for formation of the second electrode.

Figure 13:
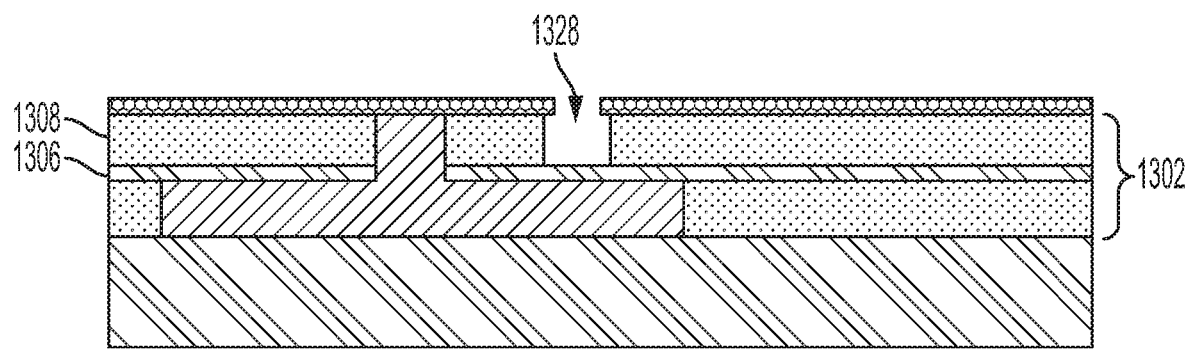
FIG. 13 is a schematic illustration of a cross-sectional view of the epitaxial stack after additional etching according to an embodiment of the present invention.

The process includes performing an additional etch to the second SiGe film, exposing the Si film. FIG. 13 is a schematic illustration of a cross-sectional view of the epitaxial stack 1302 after the additional etching. Vapor etching, for example, may be used to complete the removal of the second SiGe film 1308, exposing the Si film 1306. The Si film 1306 functions as the device dielectric of the Josephson junction. The second SiGe film 1308 defines the hole 1328 where the superconducting material forming the second electrode will be deposited.

The hard mask may be left in place at this point, and a superconducting material may be deposited in the hole 1328. The hard mask may be removed in the CMP step after the hole 1328 is filled with superconducting material, resulting in the structure shown in FIG. 15. A superconducting material such as Al can be degraded by DHF, while keeping the hard mask in place may prevent the superconducting material from being exposed and degrading.

Figure 14:
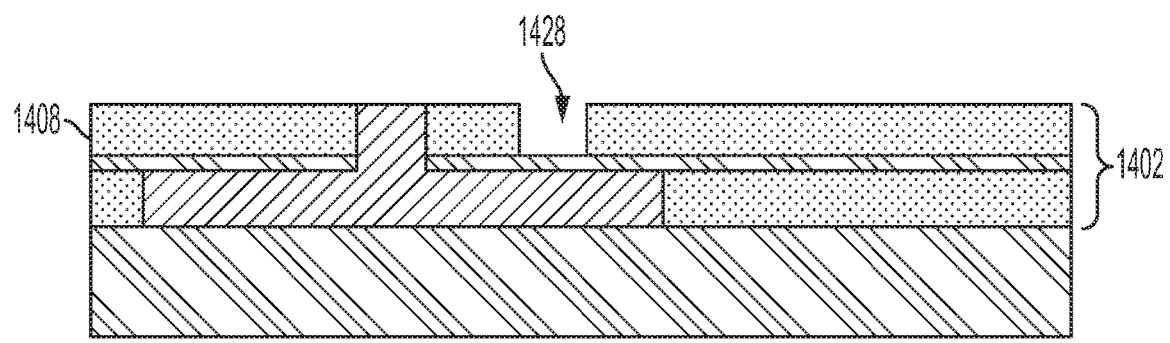
FIG. 14 is a schematic illustration of a cross-sectional view of the epitaxial stack after a silicon oxide hard mask has been removed according to an embodiment of the present invention.

Alternatively, the process includes removing the silicon oxide hard mask, for example, using DHF. FIG. 14 is a schematic illustration of a cross-sectional view of the epitaxial stack 1402 after the silicon oxide hard mask has been removed. The second SiGe film 1408 continues to define the hole 1428 where the superconducting material forming the second electrode will be deposited.

Figure 15:
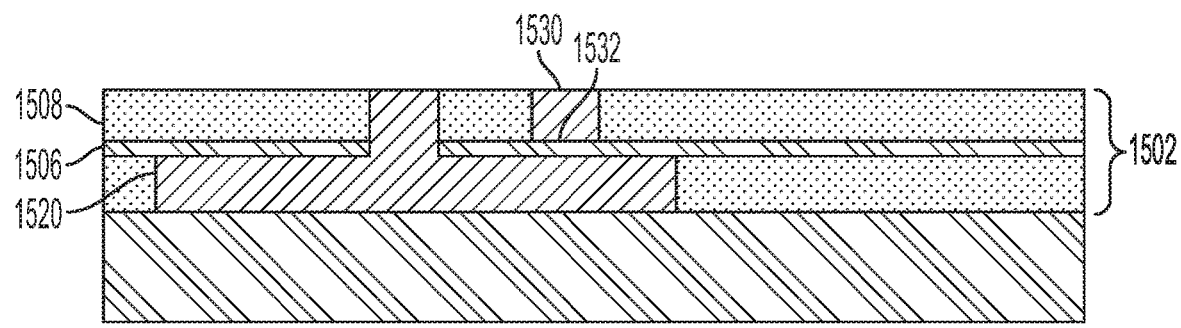
FIG. 15 is a schematic illustration of a cross-sectional view of the epitaxial stack after superconducting material has been deposited to form a second electrode according to an embodiment of the present invention.

The process includes depositing the superconducting material in the hole to form the second electrode of the Josephson junction device, and removing excess material from the upper surface of the second SiGe film, for example, using CMP. FIG. 15 is a schematic illustration of a cross-sectional view of the epitaxial stack 1502 after the superconducting material has been deposited to form the second electrode 1530. The first electrode 1520, the second electrode 1530, and the portion 1532 of the Si film 1506 between the first electrode 1520 and the second electrode 1530 form a vertical Josephson junction.

The superconducing material may be deposited using CVD, for example. The superconducting material may be Al, for example, or any other superconducting material. The superconducting material replaces a portion of the second SiGe film 1508. After the superconducting material has been deposited, any excess superconducting material deposited on the upper surface of the second SiGe film 1508 may be removed, for example, using CMP.

According to some embodiments of the invention, the process for forming a vertical Josephson junction device includes forming superconducting structures on the surface of the epitaxial stack. The superconducting structures may include wires, capacitor, and resonators, for example. The superconducting structures may incorporate the vertical Josephson junction device into a quantum circuit.

Figure 16:
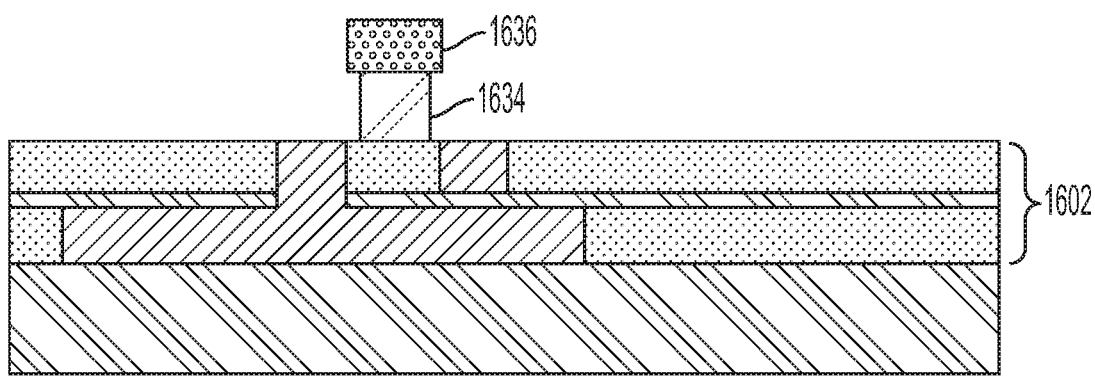
FIG. 16 is a schematic illustration of a cross-sectional view of the epitaxial stack with the patterned lift off lithography stack formed thereon according to an embodiment of the present invention.

The process for forming superconducting structures includes patterning a lift off lithography stack. FIG. 16 is a schematic illustration of a cross-sectional view of the epitaxial stack 1602 with the patterned lift off lithography stack formed thereon. The lithography stack includes a first layer 1634 and a second layer 1636 on top of the first layer 1634. The first layer 1634 is undercut to enable lift off of the stack.

Figure 17:
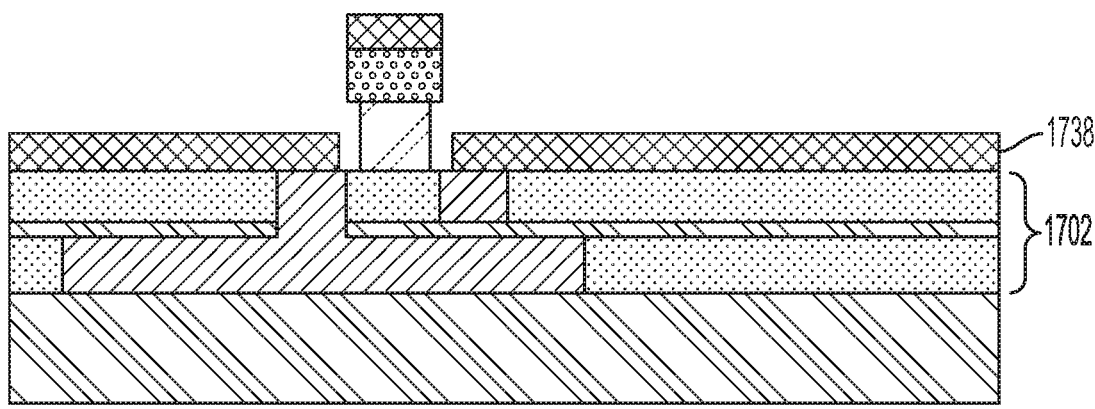
FIG. 17 is a schematic illustration of a cross-sectional view of the epitaxial stack with superconducting material deposited thereon according to an embodiment of the present invention.

The process includes depositing superconducting material to form the superconducting structures. FIG. 17 is a schematic illustration of a cross-sectional view of the epitaxial stack 1702 with superconducting material 1738 deposited thereon.

Figure 18:
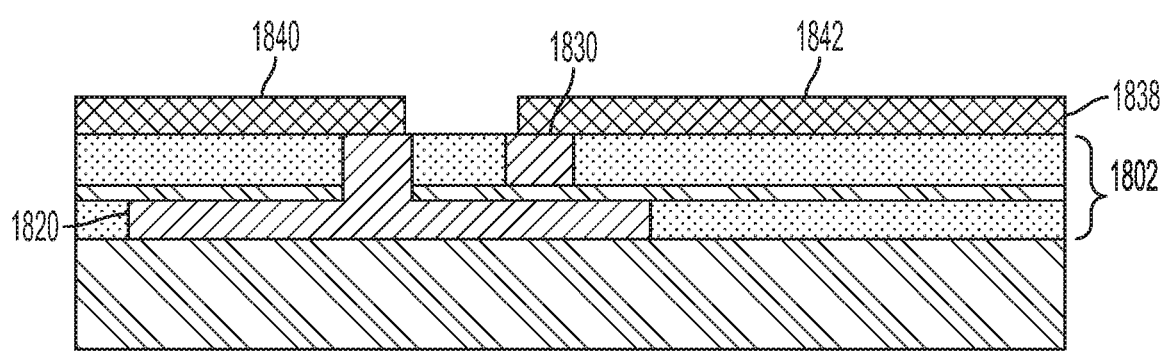
FIG. 18 is a schematic illustration of a cross-sectional view of the epitaxial stack after the lithography stack has been lifted off, leaving behind the superconducting material according to an embodiment of the present invention.

The process includes lifting off the lithography stack. FIG. 18 is a schematic illustration of a cross-sectional view of the epitaxial stack 1802 after the lithography stack has been lifted off, leaving behind the superconducting material 1838. The superconducting material 1838 may form a superconducting structure such as a wire, a resonator, or a capacitor, for example. The superconducting material 1838 according to some embodiments forms a first superconducting wire 1840 connected to the first electrode 1820, and a second superconducting wire 1842 connected to the second electrode 1830. The vertical Josephson junction device including the superconducting material 1838 may be, for example, a Josephson junction qubit.

According to some embodiments, a method of producing a vertical Josephson junction device includes fabricating a device structure with a process that avoids amorphous dielectrics and reactive ion etching (RIE) of Al. The method includes using epitaxial SiGe as the wiring dielectric, and using epitaxial Si as the junction dielectric. The method enables fabrication of a device structure with a process that avoids amorphous dielectrics and RIE of Al. The method uses a CMOS nanosheet stack and vapor etching to define the device regions, using epitaxial Si as the Josephson junction device dielectric.

According to some embodiments, a vertical JJ qubit device uses Al for upper and lower electrodes and intrinsic epitaxial Si for the junction dielectric, using SiGe as the insulator material for the wiring.

According to some embodiments, a process for producing a vertical Josephson junction device includes growing epitaxial SiGe and Si layers on a Si substrate, and depositing a Si oxide hard mask. The process includes patterning a contact hole region through the upper SiGE and Si epitaxial film, and forming a silicon oxide spacer on the upper SiGe layer. The process includes vapor etching the lower SiGe layer, stripping the Si oxide with DHF, and CVD Al to fill the etched region. The process includes using CMP to remove Al from the upper Si surface and planarize. The process includes depositing a Si oxide hard mask, patterning a device region, and, etching the Si oxide hard mask and most of the upper SiGe layer. The process includes vapor etching to complete the etch of the upper SiGe layer, stopping on Si. The process includes DHF removal of oxide hard mask. Alternatively, the hard mask can be left in place at this point, and removed in the metal CMP step after the hole is filled with metal. Al can be degraded by DHF, so instead of removing the hard mask and exposing Al, the hard mask may be left in place and later removed with CMP. The process includes superconductor deposition to fill the upper electrode, e.g. Al. The process includes CMP to remove Al from the Si surface, patterning a lift off stack for capacitor and resonator wiring, depositing a superconductor, and lifting off the stack to form metal wiring.

Figure 19:
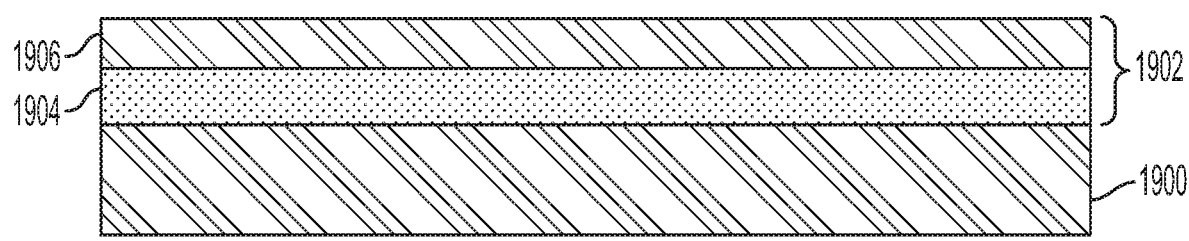
FIG. 19 is a cross-sectional view of a substrate according to an embodiment of the present invention.

FIGS. 19-33 schematically illustrate an example process for forming a vertical Josephson junction device according to some embodiments of the present invention. FIG. 19 is a cross-sectional view of a substrate 1900. The process includes forming an epitaxial stack 1902 on the substrate 1900. The epitaxial stack may include a plurality of epitaxial films, or nanosheets. According to some embodiments, the substrate 1900 is a Si substrate. According to some embodiments, the epitaxial stack 1902 includes a SiGe film 1904 formed on the substrate 1900, and a Si film 1906 formed on the SiGe film 1904. The SiGe film 1904 and Si film 1906 may each be formed epitaxially. Embodiments of the invention are not listed to these materials, however. The substrate 1900 and epitaxial stack 1902 may include alternative or additional materials.

Figure 20:
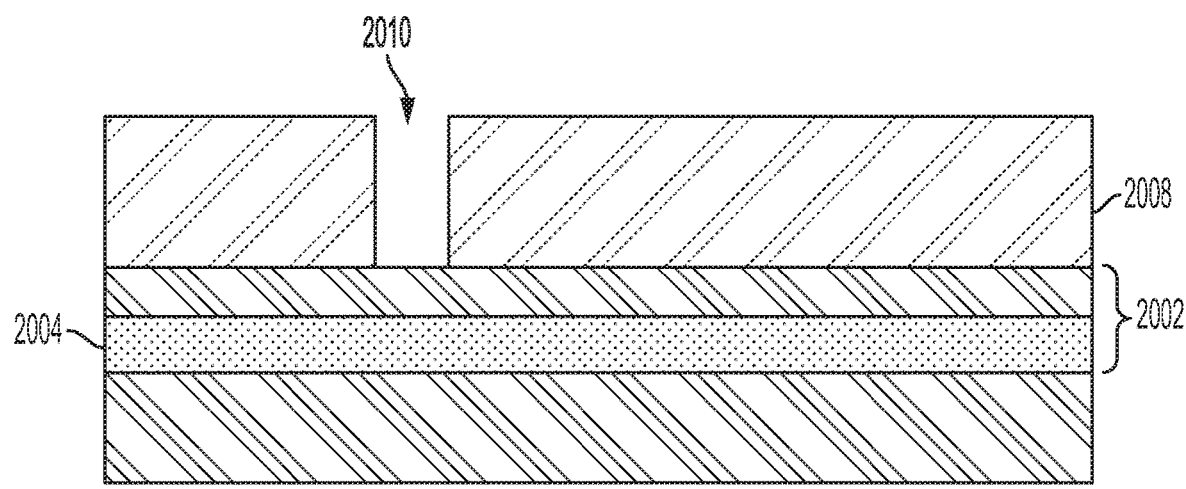
FIG. 20 is a schematic illustration of a cross-sectional view of a lithography stack formed on an epitaxial stack according to an embodiment of the present invention.

The process includes forming a lithography stack on the epitaxial stack, and patterning contact hole regions to access a lower layer of the epitaxial stack. FIG. 20 is a schematic illustration of a cross-sectional view of a lithography stack 2008 formed on an epitaxial stack 2002. The process includes patterning contact hole regions to access a layer, for example, the SiGe layer 2004, of the epitaxial stack 2002. In FIG. 20, the lithography stack 2008 has been etched to form a contact hole region 2010.

Figure 21:
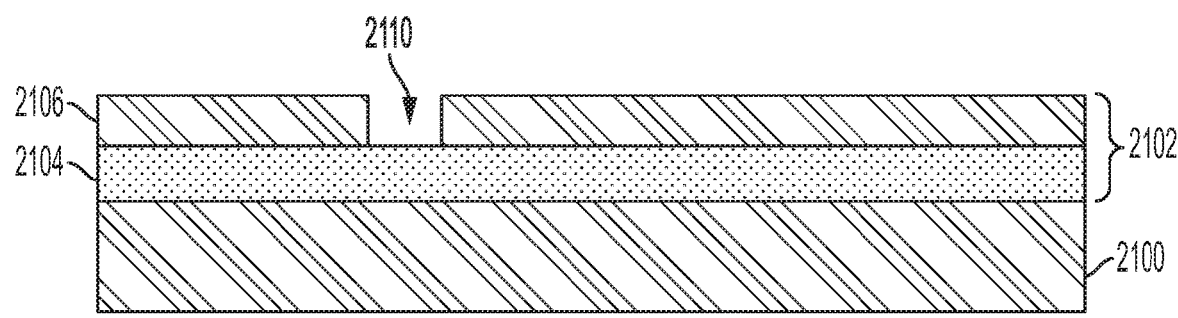
FIG. 21 is a schematic illustration of a cross-sectional view of the substrate and epitaxial stack after the contact hole region has been etched, and the lithography stack stripped according to an embodiment of the present invention.

The process includes etching the contact hole regions to access a lower layer of the epitaxial stack, and then stripping the lithography stack. FIG. 21 is a schematic illustration of a cross-sectional view of the substrate 2100 and epitaxial stack 2102 after the contact hole region has been etched, and the lithography stack stripped. The epitaxial stack 2102 includes a hole region 2110 where a portion of the Si film 2106 has been etched. A surface of the SiGe film 2104 is exposed by the hole region 2110.

Figure 22:
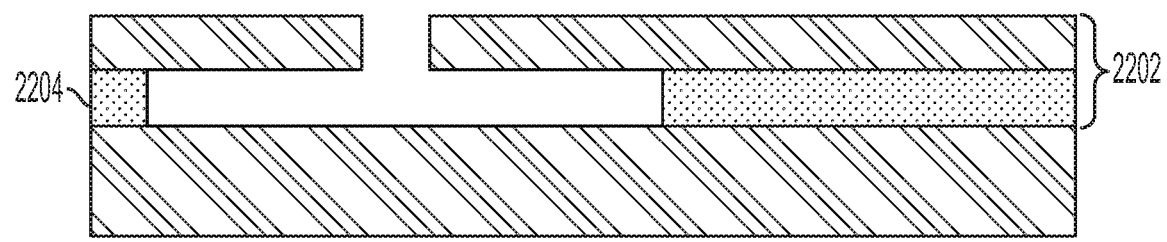
FIG. 22 is a schematic illustration of a cross-sectional view of the epitaxial stack after a portion of the SiGe film has been removed according to an embodiment of the present invention.

The process includes removing a portion of the SiGe film. FIG. 22 is a schematic illustration of a cross-sectional view of the epitaxial stack 2202 after a portion of the SiGe film 2204 has been removed. The portion of the SiGe film 2204 may be removed by, for example, vapor etching with nanosheet processing.

Figure 23:
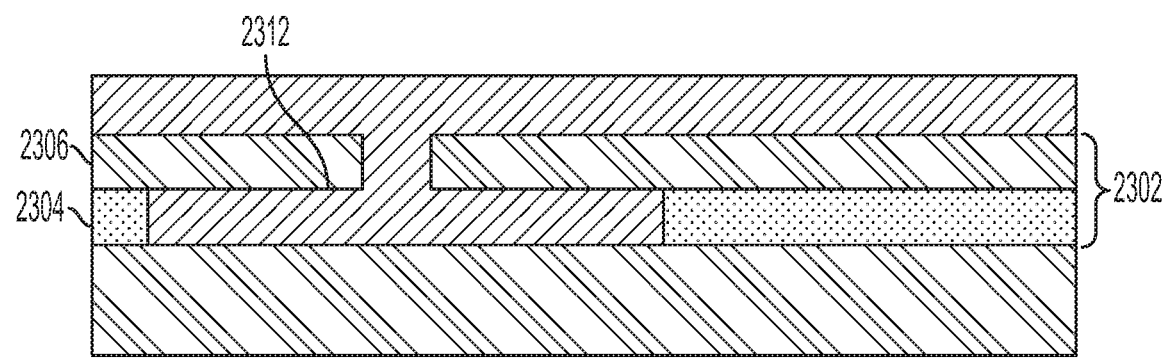
FIG. 23 is a schematic illustration of a cross-sectional view of a superconducting material deposited in the etched region of the epitaxial stack according to an embodiment of the present invention.

The process includes depositing a superconducting material to form a first electrode. FIG. 23 is a schematic illustration of a cross-sectional view of a superconducting material deposited in the etched region of the epitaxial stack 2302. The superconducting material forms a first electrode 2312. The superconducting material replaces a portion of the SiGe film 2304. The superconducting material may also replace a portion of the Si film 2306, as illustrated in FIG. 23. The superconducting material may be, for example, Al, and may be deposited using CVD Al, for example, AlMe2H/H2 plasma deposition, or using Al ALD. The process may include ALD of a liner, for example, TiN or TaN.

Figure 24:
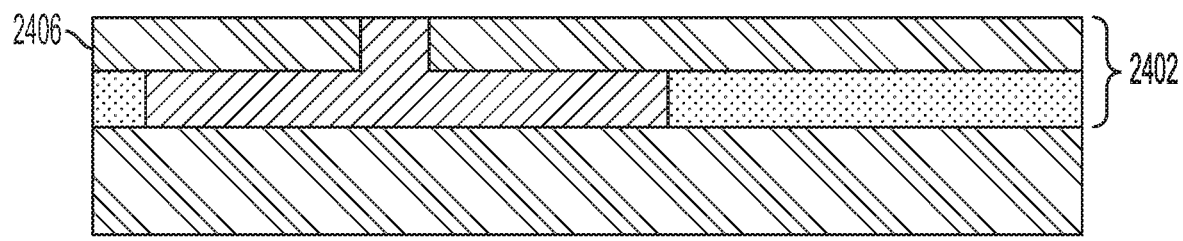
FIG. 24 is a schematic illustration of a cross-sectional view of the epitaxial stack after the excess superconducting material has been removed according to an embodiment of the present invention.

The process includes removing excess material formed on the surface of the epitaxial stack. FIG. 24 is a schematic illustration of a cross-sectional view of the epitaxial stack 2402 after the excess superconducting material has been removed. The excess material may be removed from the top surface of the Si film 2406, using, for example, CMP. CMP may also be used to planarize the surface of the epitaxial stack 2402.

Figure 25:
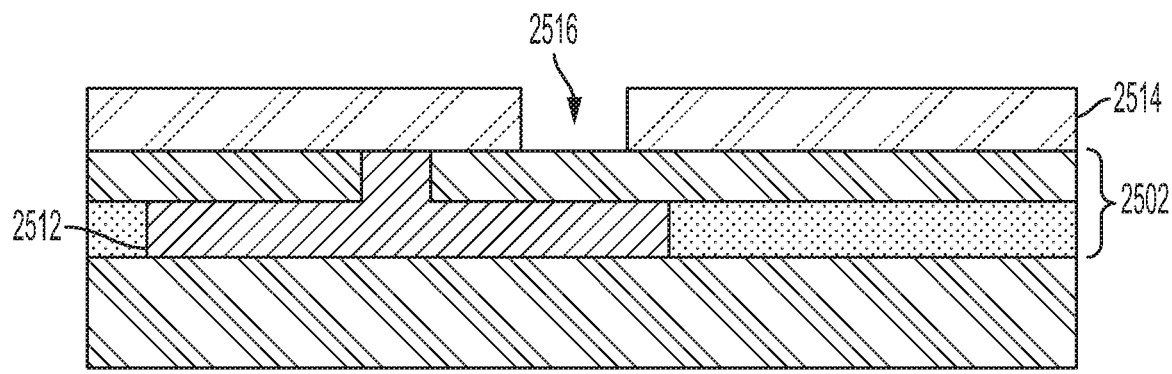
FIG. 25 is a schematic illustration of a cross-sectional view of the epitaxial stack and first electrode with a lithography stack formed on the epitaxial stack according to an embodiment of the present invention.

The process includes depositing and patterning a lithography stack to form the second electrode of the Josephson junction device. FIG. 25 is a schematic illustration of a cross-sectional view of the epitaxial stack 2502 and first electrode 2512 with a lithography stack 2514 formed on the epitaxial stack 2502. The lithography stack 2514 has been patterned to form a hole 2516.

Figure 26:
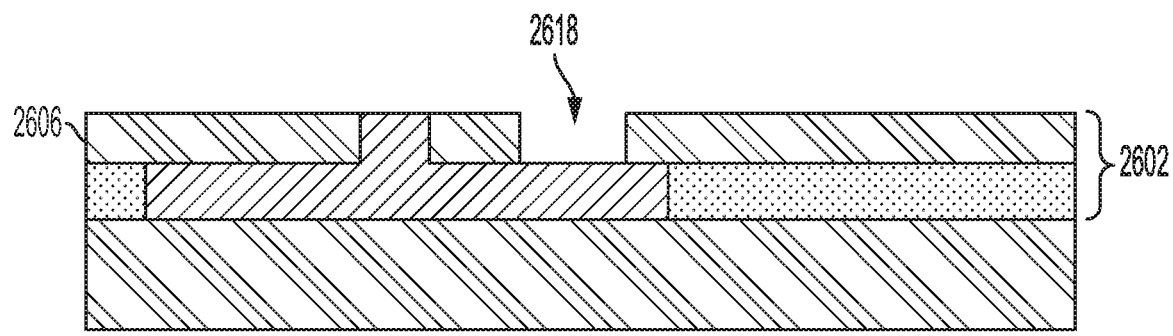
FIG. 26 is a schematic illustration of a cross-sectional view of the epitaxial stack after the etching and subsequent stripping of the lithography stack according to an embodiment of the present invention.

The process includes etching the Si film for the second electrode, and stripping the lithography stack. FIG. 26 is a schematic illustration of a cross-sectional view of the epitaxial stack 2602 after the etching and subsequent stripping of the lithography stack. The Si film 2606 has been etched to expose the first electrode 2612, creating a hole 2618 for formation of the second electrode.

Figure 27:
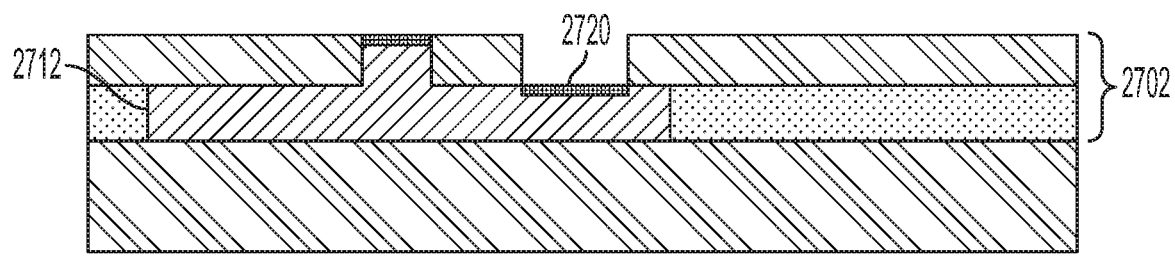
FIG. 27 is a schematic illustration of a cross-sectional view of the epitaxial stack after the cleaning, and after a newly exposed surface of the first electrode has been amorphized according to an embodiment of the present invention.

The process includes cleaning the surface of the first electrode, and amorphizing a region of the first electrode to enhance oxide uniformity. FIG. 27 is a schematic illustration of a cross-sectional view of the epitaxial stack 2702 after the cleaning, and after the newly exposed surface of the first electrode 2712 has been amorphized. The surface of the first electrode 2712 may be cleaned in situ. For example, if the first electrode 2712 comprises Al, the Al surface may be cleaned in situ, in the Al deposition tool. Cluster ion implant may be used to amorphize the Al surface, enhancing the uniformity of the oxide layer formed thereon. FIG. 27 shows the amorphized Al region 2720 formed by cluster ion implant.

Figure 28:
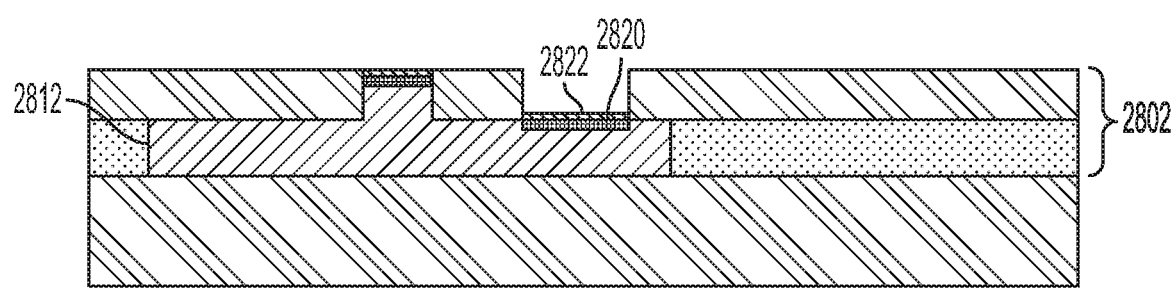
FIG. 28 is a schematic illustration of a cross-sectional view of the epitaxial stack with a dielectric layer formed on the amorphized region of the first electrode according to an embodiment of the present invention.

The process includes depositing or growing a dielectric layer on the amorphized region of the first electrode. FIG. 28 is a schematic illustration of a cross-sectional view of the epitaxial stack 2802 with a dielectric layer 2822 formed on the amorphized region 2820 of the first electrode 2812. The dielectric layer 2822 may be, for example, Al oxide. The dielectric layer 2822 may be thinner than the amorphized region 2820. The amorphized region 2820 may enhance the uniformity of the dielectric layer 2822.

Figure 29:
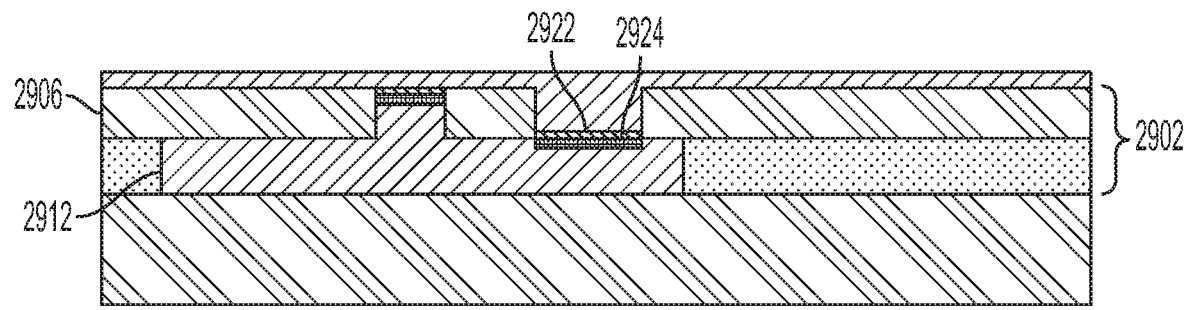
FIG. 29 is a schematic illustration of a cross-sectional view of the epitaxial stack after the superconducting material has been deposited to form the second electrode according to an embodiment of the present invention.

The process includes depositing the superconducing material on the dielectric layer to form the second electrode of the Josephson junction device. FIG. 29 is a schematic illustration of a cross-sectional view of the epitaxial stack 2902 after the superconducting material has been deposited to form the second electrode 2924. The first electrode 2912, the second electrode 2924, and the dielectric layer 2922 form a vertical Josephson junction.

The superconducting material may be deposited using CVD, for example. The superconducting material may be Al, for example, or any other superconducting material. The superconducting material replaces a portion of the second Si film 2906.

Figure 30:
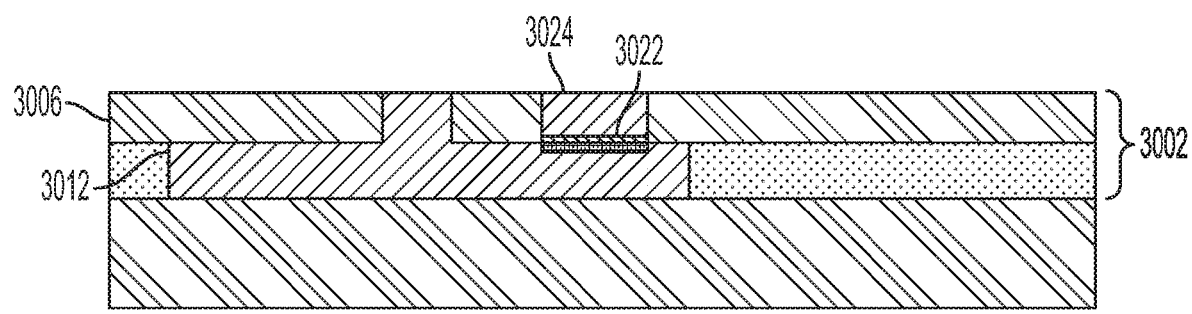
FIG. 30 is a schematic illustration of a cross-sectional view of the epitaxial stack after any excess superconducting material deposited on the upper surface of the Si film has been removed, and the surface has been planarized according to an embodiment of the present invention.

The process includes removing excess material from the upper surface of the Si film and planarizing the surface, for example, using CMP. FIG. 30 is a schematic illustration of a cross-sectional view of the epitaxial stack 3002 after any excess superconducting material deposited on the upper surface of the Si film 3006 has been removed, and the surface has been planarized. As illustrated in FIG. 30, the first electrode 3012, the dielectric layer 3022, and the second electrode 3024 are laterally encased by the epitaxial stack 3002. The epitaxial stack thus isolates the vertical Josephson junction from the environment.

According to some embodiments of the invention, the process for forming a vertical Josephson junction device includes forming superconducting structures on the surface of the epitaxial stack. The superconducting structures may include wires, capacitor, and resonators, for example. The superconducting structures may incorporate the vertical Josephson junction device into a quantum circuit.

Figure 31:
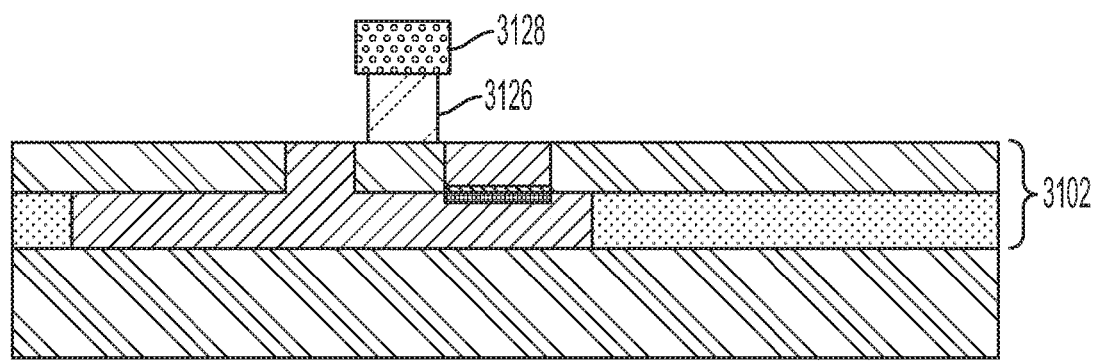
FIG. 31 is a schematic illustration of a cross-sectional view of the epitaxial stack with the patterned lift off lithography stack formed thereon according to an embodiment of the present invention.

The process for forming superconducting structures includes patterning a lift off lithography stack. FIG. 31 is a schematic illustration of a cross-sectional view of the epitaxial stack 3102 with the patterned lift off lithography stack formed thereon. The lithography stack includes a first layer 3126 and a second layer 3128 on top of the first layer 3126. The first layer 3126 is undercut to enable lift off of the stack.

Figure 32:
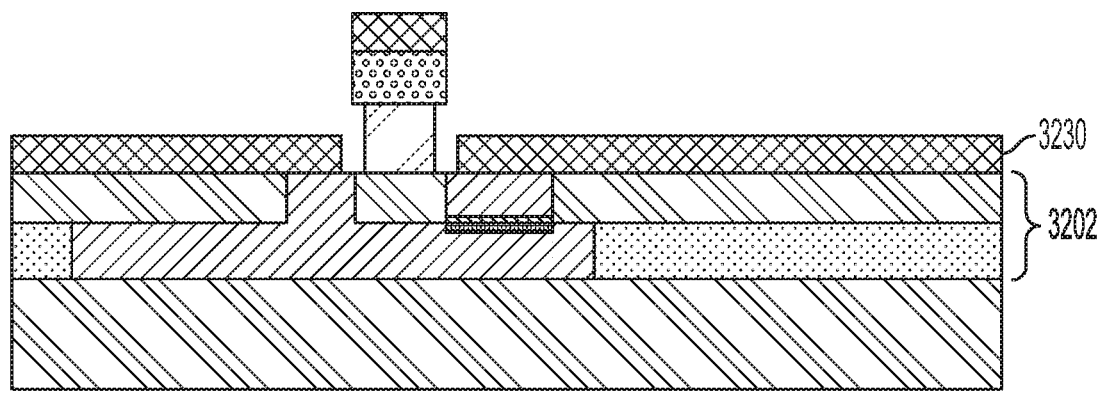
FIG. 32 is a schematic illustration of a cross-sectional view of the epitaxial stack with superconducting material deposited thereon according to an embodiment of the present invention.

The process includes depositing superconducting material to form the superconducting structures. FIG. 32 is a schematic illustration of a cross-sectional view of the epitaxial stack 3202 with superconducting material 3230 deposited thereon.

Figure 33:
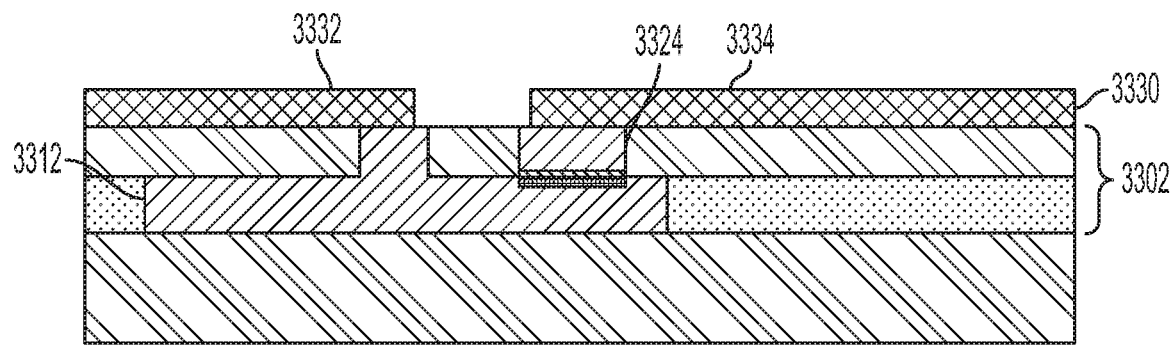
FIG. 33 is a schematic illustration of a cross-sectional view of the epitaxial stack after the lithography stack has been lifted off, leaving behind the superconducting material according to an embodiment of the present invention.

The process includes lifting off the lithography stack. FIG. 33 is a schematic illustration of a cross-sectional view of the epitaxial stack 3302 after the lithography stack has been lifted off, leaving behind the superconducting material 3330. The superconducting material 3330 may form a superconducting structure such as a wire, a resonator, or a capacitor, for example. The superconducting material 3330 according to some embodiments forms a first superconducting wire 3332 connected to the first electrode 3312, and a second superconducting wire 3334 connected to the second electrode 3324. The vertical Josephson junction device including the superconducting material 3330 may be, for example, a Josephson junction qubit.

According to some embodiments, a method of producing a vertical Josephson junction device includes fabricating a device structure with a process that avoids amorphous dielectrics and reactive ion etching (RIB) of Al. The method includes using epitaxial Si as the wiring dielectric, and using cluster ion implant to amorphize the Al surface prior to Al oxide growth for the junction dielectric. The method enables fabrication of a device structure with a process that avoids amorphous dielectrics and RIE of Al. Epitaxial Si is used as the wiring dielectric, while cluster ion implant is used to amorphize the Al surface prior to Al oxide growth for the junction dielectric.

According to some embodiments, a vertical JJ qubit device uses Al for upper and lower electrodes and Al oxide for the junction dielectric, using intrinsic Si as the insulator material for the wiring.

According to some embodiments, a process for producing a vertical Josephson junction device includes growing epitaxial SiGe and Si layers on a Si substrate. The embodiments of the invention are not limited to these materials, however. The substrate and epitaxial stack may include alternative or additional materials. For example, the substrate may be a Ge substrate. The layers of the epitaxial stack, including the Josephson junction dielectric, may include Si, Ge, or SiGe, for example.

The process includes patterning a contact hole region through the Si epitaxial film to expose the SiGe film. The process includes vapor etching the SiGe layer, CVD Al to fill the etched region, and using CMP to remove Al from upper Si surface and planarize. The process includes patterning a device region, in situ cleaning, and cluster ion implanting the Al surface. The process includes growing the device dielectric, and CVD Al or other Josephson junction superconductor to fill the device region. The process includes CMP to remove Al from Si surface and planarize. The process includes patterning a lithography stack for superconducting capacitors and resonators, depositing superconductor, and lifting off to form metal wiring.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical Josephson junction device, comprising:
   a substrate;
   an epitaxial stack formed on the substrate;
   a first superconducting electrode embedded in said epitaxial stack; and
   a second superconducting electrode embedded in said epitaxial stack, said second superconducting electrode being separated from said first superconducting electrode by a dielectric layer,
   wherein, in operation, said first superconducting electrode, said dielectric layer, and said second superconducting electrode form a vertical Josephson junction, and
   wherein said epitaxial stack laterally encases said vertical Josephson junction.

2. The vertical Josephson junction device according to claim 1, wherein said dielectric layer comprises a layer of said epitaxial stack.

3. The vertical Josephson junction device according to claim 1, wherein said dielectric layer comprises an oxide layer formed on said first superconducting electrode.

4. The vertical Josephson junction device according to claim 1, further comprising a first superconducting wire connected to said first superconducting electrode, and a second superconducting wire connected to said second superconducting electrode.

5. The vertical Josephson junction device according to claim 4, wherein said first superconducting wire and said second superconducting wire are formed on a surface of said epitaxial stack.

6. The vertical Josephson junction device according to claim 4, wherein said vertical Josephson junction device is a Josephson junction qubit.

7. A vertical Josephson junction device, comprising:
   a substrate;
   an epitaxial stack formed on the substrate;
   a first superconducting electrode embedded in said epitaxial stack; and
   a second superconducting electrode embedded in said epitaxial stack, said second superconducting electrode being separated from said first superconducting electrode by a dielectric layer,
   wherein, in operation, said first superconducting electrode, said dielectric layer, and said second superconducting electrode form a vertical Josephson junction, and
   wherein said epitaxial stack isolates said vertical Josephson junction from an environment.

8. A vertical Josephson junction device, comprising:
   a substrate;
   an epitaxial stack formed on the substrate;
   a first superconducting electrode embedded in said epitaxial stack; and
   a second superconducting electrode embedded in said epitaxial stack, said second superconducting electrode being separated from said first superconducting electrode by a dielectric layer,
   wherein, in operation, said first superconducting electrode, said dielectric layer, and said second superconducting electrode form a vertical Josephson junction, and
   wherein said epitaxial stack comprises a SiGe epitaxial film and a Si epitaxial film.

9. The vertical Josephson junction device according to claim 8, wherein said epitaxial stack further comprises a second SiGe epitaxial film.

* * * * *